(12) United States Patent
Kamata et al.

(10) Patent No.: US 8,395,154 B2
(45) Date of Patent: Mar. 12, 2013

(54) THIN FILM TRANSISTOR SUBSTRATE AND METHOD OF MANUFACTURING THE SAME

(75) Inventors: Yuuki Kamata, Himeji (JP); Yuuichi Nishimura, Togane (JP); Kunihiko Watanabe, Mobara (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 164 days.

(21) Appl. No.: 12/816,488

(22) Filed: Jun. 16, 2010

(65) Prior Publication Data
US 2010/0320468 A1 Dec. 23, 2010

(30) Foreign Application Priority Data
Jun. 19, 2009 (JP) ................... 2009-146479

(51) Int. Cl.
*H01L 29/04* (2006.01)
(52) U.S. Cl. .......................... 257/57; 438/401
(58) Field of Classification Search .................. 257/59, 257/E21.525, E23.179, 57; 438/401
See application file for complete search history.

(56) References Cited

U.S. PATENT DOCUMENTS

| | | | | |
|---|---|---|---|---|
| 6,157,421 A * | 12/2000 | Ishii | ................................ | 349/43 |
| 6,787,930 B1 * | 9/2004 | Nakata et al. | ................. | 257/797 |
| 7,808,608 B2 * | 10/2010 | Park et al. | ..................... | 349/191 |
| 7,911,561 B2 * | 3/2011 | Seok et al. | ....................... | 349/74 |
| 2005/0140298 A1 * | 6/2005 | Chen et al. | ..................... | 313/582 |
| 2005/0155704 A1 * | 7/2005 | Yokajty et al. | ................ | 156/295 |
| 2006/0279687 A1 * | 12/2006 | Park et al. | ..................... | 349/142 |
| 2007/0009813 A1 * | 1/2007 | Fujita | ............................... | 430/22 |
| 2007/0045624 A1 * | 3/2007 | Satou et al. | ..................... | 257/49 |

FOREIGN PATENT DOCUMENTS
JP 1-154124 6/1989

* cited by examiner

*Primary Examiner* — Julio J Maldonado
*Assistant Examiner* — Robert Bachner
(74) *Attorney, Agent, or Firm* — Antonelli, Terry, Stout & Kraus, LLP.

(57) ABSTRACT

In a portion of a gate signal line and a portion of a common signal line, cutouts which are arranged perpendicular to the extending direction of these lines and open to face each other in an opposed manner are formed. A cruciform shape in appearance is formed by combining a gap defined between the gate signal line and the common signal line extending parallel to each other and the cutouts to each other. The cruciform portion formed in this manner is used as an alignment mark in the exposure of a photolithography step of a layer formed later. Due to such a constitution, in manufacturing a thin film transistor substrate, it is possible to realize the highly accurate alignment without forming a pattern only used for alignment.

14 Claims, 13 Drawing Sheets

THIN FILM TRANSISTOR SUBSTRATE AND METHOD OF MANUFACTURING THE SAME

CROSS-REFERENCE TO RELATED APPLICATION

The present application claims priority from Japanese application JP2009-146479 filed on Jun. 19, 2009, the content of which is hereby incorporated by reference into this application.

BACKGROUND OF THE INVENTION

1. Field of the Invention

The present invention relates to a thin film transistor substrate and a method of manufacturing the thin film transistor substrate, and more particularly to a thin film transistor substrate which controls a display of a display device and a method of manufacturing the thin film transistor substrate.

2. Description of the Related Art

As one of display devices for information communication terminals such as computers or for television receiver sets, a liquid crystal display device has been popularly used. The liquid crystal display device is a device which is configured to control an image to be displayed by changing the degree of optical transmissivity with a control of orientation of liquid crystal composition sealed between a thin film transistor substrate (hereinafter referred to as "TFT substrate") and a color filter substrate.

The TFT substrate used in such a liquid crystal display device has pixels number of which corresponds to the resolution of an image, and each pixel includes a transistor for applying a voltage of a video signal to an electrode. Each layer for forming the transistor such as gate layer, semiconductor layer and source/drain layer is formed by a photolithography step which is a known semiconductor process. In this step, in performing the exposure of a pattern of each layer, it is necessary to perform the alignment for aligning a layer with the previously formed layer.

JP 2007-17465 A (related US patent application: US2007/0009813A1) discloses a technique where an alignment mark is provided for every layer such as a source line layer or a gate line layer of a TFT substrate, and the alignment mark is used at the time of superposing the TFT substrate and a color filter substrate on each other.

JP 1-154124 A discloses an alignment mark which is formed within a display region of a TFT substrate as an alignment mark used at the time of forming respective layers.

SUMMARY OF THE INVENTION

However, when the alignment mark is formed outside the display region, a region which cannot be used as a product is needed on a glass substrate and hence, the area of the glass substrate is not efficiently used. On the other hand, to consider a case where the alignment marks are superposed on each other as disclosed in JP 2007-17465 A (related US patent application: US2007/0009813A1), when positional displacement occurs, there may be a case where the an erroneous detection of the alignment marks occurs, so that the alignment marks become no more suitable for the alignment. Further, even in the case where the alignment mark is formed within the display region as disclosed in JP 1-154124 A, the formation of the independent pattern used only for alignment largely influences other lines and can cause the deterioration of the yield rate.

The invention has been made under such circumstances, and an object of the invention is providing a thin film transistor substrate which is used a highly accurate alignment mark which is not the patterns only for the alignment mark, but the patterns functionally required, and a method of manufacturing the thin film transistor substrate.

According to one aspect of the invention, there is provided a thin film transistor substrate which controls a display of a display device, comprising a first metal line to which a voltage is applied by a driver circuit, wherein the first metal line includes a first shape as a portion of alignment mark.

Further, in the thin film transistor substrate of the invention, the first metal line may be formed of a gate line of a transistor.

Further, in the thin film transistor substrate of the invention, the first shape may be formed by a cutout and, in this case, the cutout may have a cruciform shape. Further, the first shape may be formed by a projecting portion extending in the direction perpendicular to an extending direction of the first metal line.

Further, the thin film transistor substrate of the invention may further comprise a second metal line which is parallel to an extending direction of the first metal line, and the second metal line includes the first shape as a part of the alignment mark as well as the first metal line. In this case, in the above-mentioned two lines extending parallel to each other, the first shape may be formed by cutouts which are arranged perpendicular to the extending direction and are opened in an opposed manner. Further, in the above-mentioned two lines extending parallel to each other, the first shape may be formed by projecting portions extending in the direction perpendicular to the extending direction.

Further, the thin film transistor substrate of the invention may further comprise a pattern which is electrically independent from the first metal line and to which a voltage is not applied, and the pattern may form the alignment mark together with the first shape.

Further, the thin film transistor substrate of the invention may further comprise a metal electrode or a second metal line which differs from the first metal line. The metal electrode or the second metal line may have a second shape, and the second shape may form the alignment mark together with the first shape. In this case, the metal electrode or the second metal line may be formed of a source/drain line.

According to another aspect of the invention, there is provided a method of manufacturing a thin film transistor substrate which controls a display of a display device, the method includes forming a first metal line which has a first shape in at least a part thereof, and performing alignment and exposure using the first shape as a portion of an alignment mark.

Further, the method of manufacturing a thin film transistor substrate of the invention may further include, forming a metal electrode or a second metal line which has a second shape after the forming the first metal line which has the first shape, and the performing alignment is performed by using the second shape as the alignment mark together with the first shape.

Further, in the method of manufacturing a thin film transistor substrate of the invention, the performing alignment may be performed by using the center of a displaced distance as an alignment position when a position of the first shape and a position of the second shape are displaced from a correct position.

DETAILED DESCRIPTION OF THE INVENTION

The embodiment of the invention is explained in conjunction with drawings hereinafter. In the drawing, the same symbols are given to identical or equivalent elements and their repeated explanation is omitted.

Figure 1:
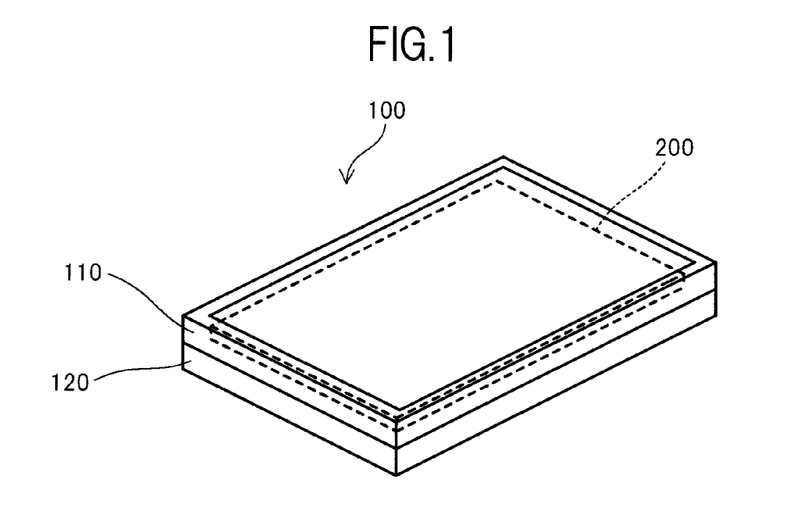
FIG. 1 is a view schematically showing a liquid crystal display device according to one embodiment of the invention.

FIG. 1 schematically shows a liquid crystal display device 100 according to one embodiment of the invention. As shown in FIG. 1, the liquid crystal display device 100 is constituted of a liquid crystal panel 200 which is sandwiched between an upper frame 110 and a lower frame 120, a backlight device not shown in the drawing and the like.

Figure 2:
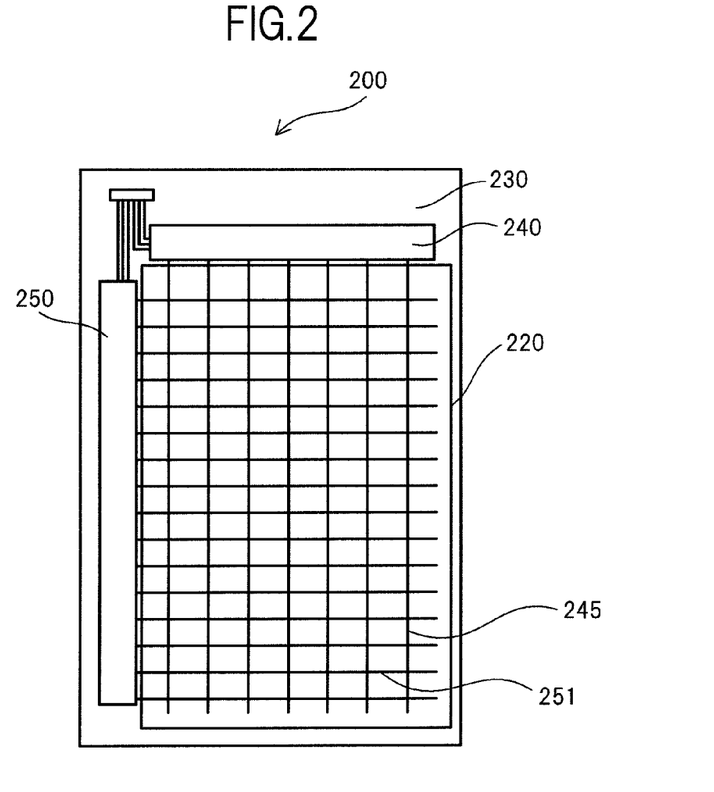
FIG. 2 is a view showing the constitution of a liquid crystal panel in FIG. 1.

FIG. 2 shows the constitution of the liquid crystal panel 200. The liquid crystal panel 200 includes two substrates consisting of a TFT substrate 230 and a color filter substrate 220, and liquid crystal composition is sealed in a space defined between these substrates. Gate signal lines 245 which are controlled by a drive circuit 240 and drain signal lines 251 which are controlled by a drive circuit 250 are arranged on the TFT substrate 230, and these signal lines form cells each of which functions as one pixel of the liquid crystal display device 100. Although the number of cells which the liquid crystal panel 200 includes corresponds to the resolution of the image display, to prevent the drawing from becoming complicated, the constitution of the liquid crystal panel 200 is shown in a simplified manner in FIG. 2. Further, control signals including video signals are inputted to the respective drive circuits 240, 250 from a processing unit not shown in the drawing, and the liquid crystal panel 200 performs a display by controlling the orientation of liquid crystal composition.

Figure 3:
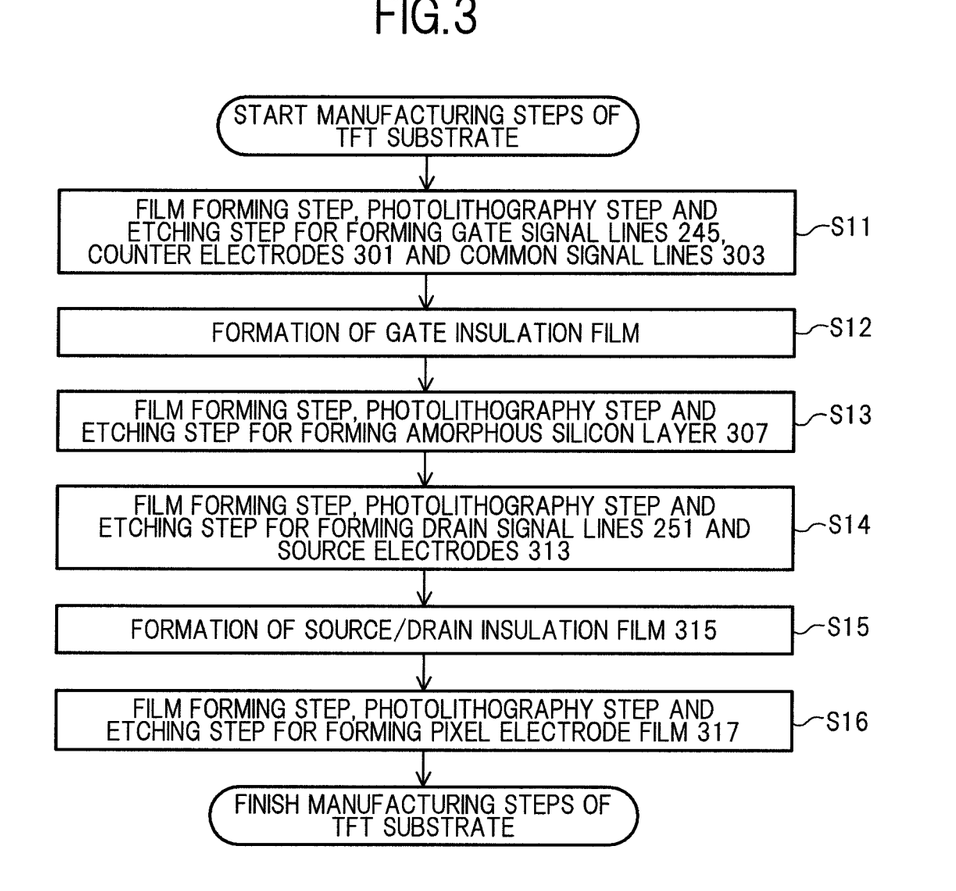
FIG. 3 is a flowchart schematically showing manufacturing steps of a TFT substrate in FIG. 2.

FIG. 3 schematically shows manufacturing steps of the TFT substrate 230. Here, each of a film forming step, a photolithography step and an etching step which are included in respective steps is performed using a step of a known semiconductor process and hence, the explanation of each of the steps is omitted.

Figure 4:
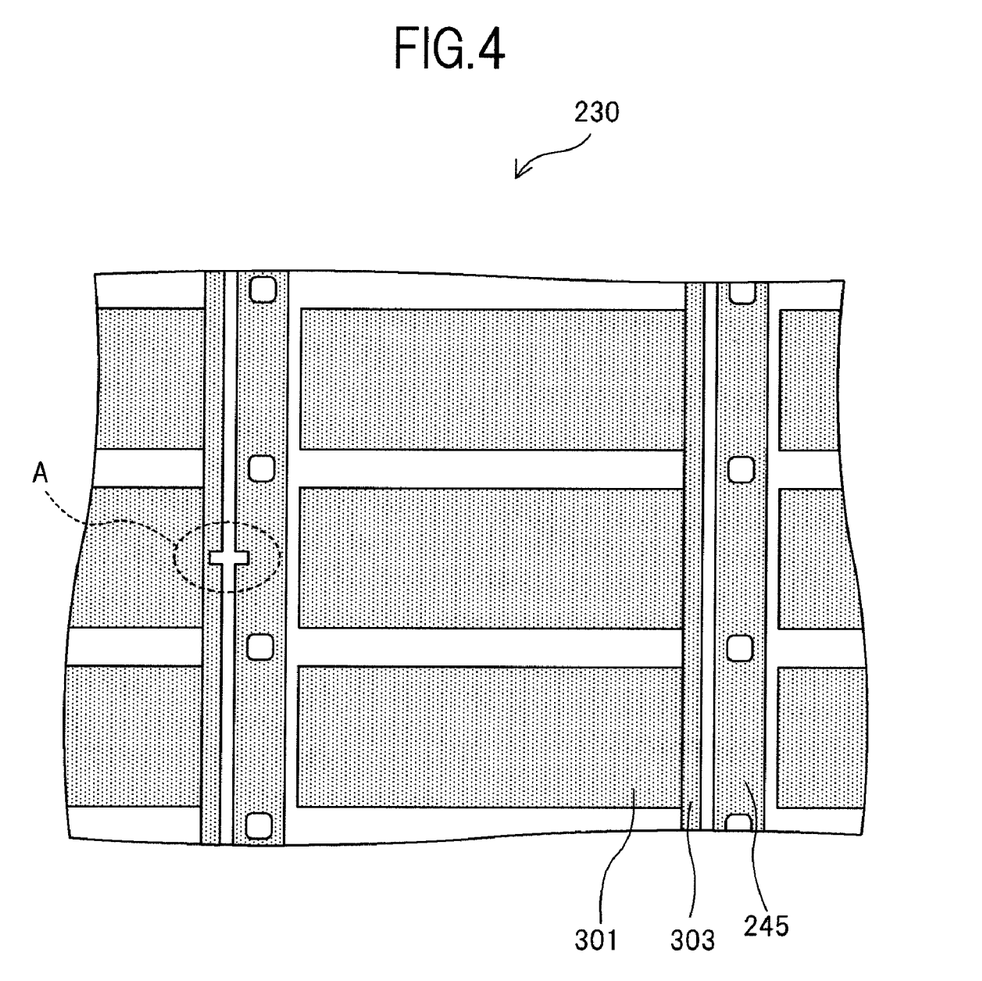
FIG. 4 is a view showing a state where gate signal lines, counter electrodes and common signal lines of a TFT substrate are formed.

As shown in FIG. 3, in the manufacturing steps of the TFT substrate 230, first of all, in step S11, the gate signal lines 245, the counter electrodes 301 and the common signal lines 303 are formed by the film forming step, the photolithography step and the etching step. FIG. 4 shows a state where the gate signal lines 245, the counter electrodes 301 and the common signal lines 303 are formed. As shown in a portion "A" in FIG. 4, the cutouts are formed in a portion of the gate signal line 245 and a portion of the common signal line 303 such that the cutouts extend in the direction perpendicular to the extending direction of the gate signal lines 245 and the common signal lines 303, and are opened to face each other in an opposed manner. By combining a gap defined between the gate signal line 245 and the common signal line 303 which extend parallel to each other and the cutouts with each other, a portion having a cruciform shape in appearance is formed.

Figure 5:
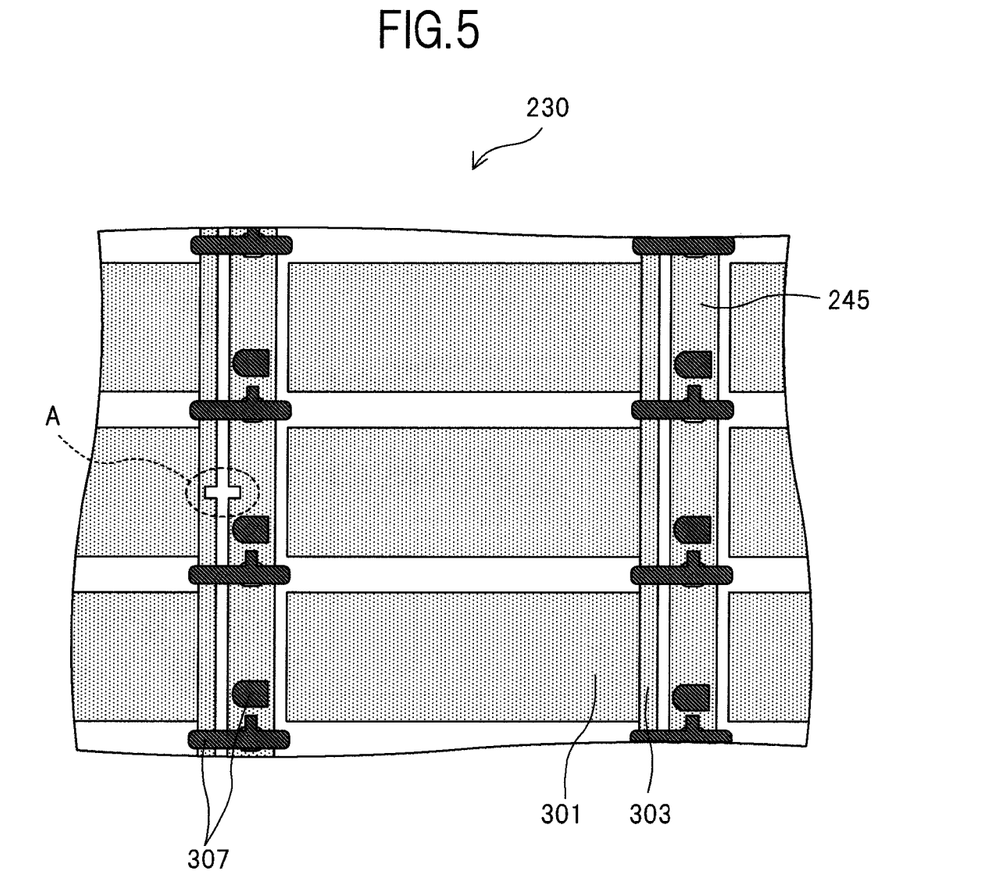
FIG. 5 is a view showing a state where an amorphous silicon layer of the TFT substrate is formed.

Returning to FIG. 3, as a next step, a gate insulation film is formed in step S12. Subsequently, an amorphous silicon layer 307 is formed by a film forming step, a photolithography step and an etching step in step S13. Here, at the time of performing the exposure in the photolithography step, the alignment is performed using the portion "A" in FIG. 4 as an alignment mark. FIG. 5 shows a state of the amorphous silicon layer 307 formed in this manner.

Figure 6:
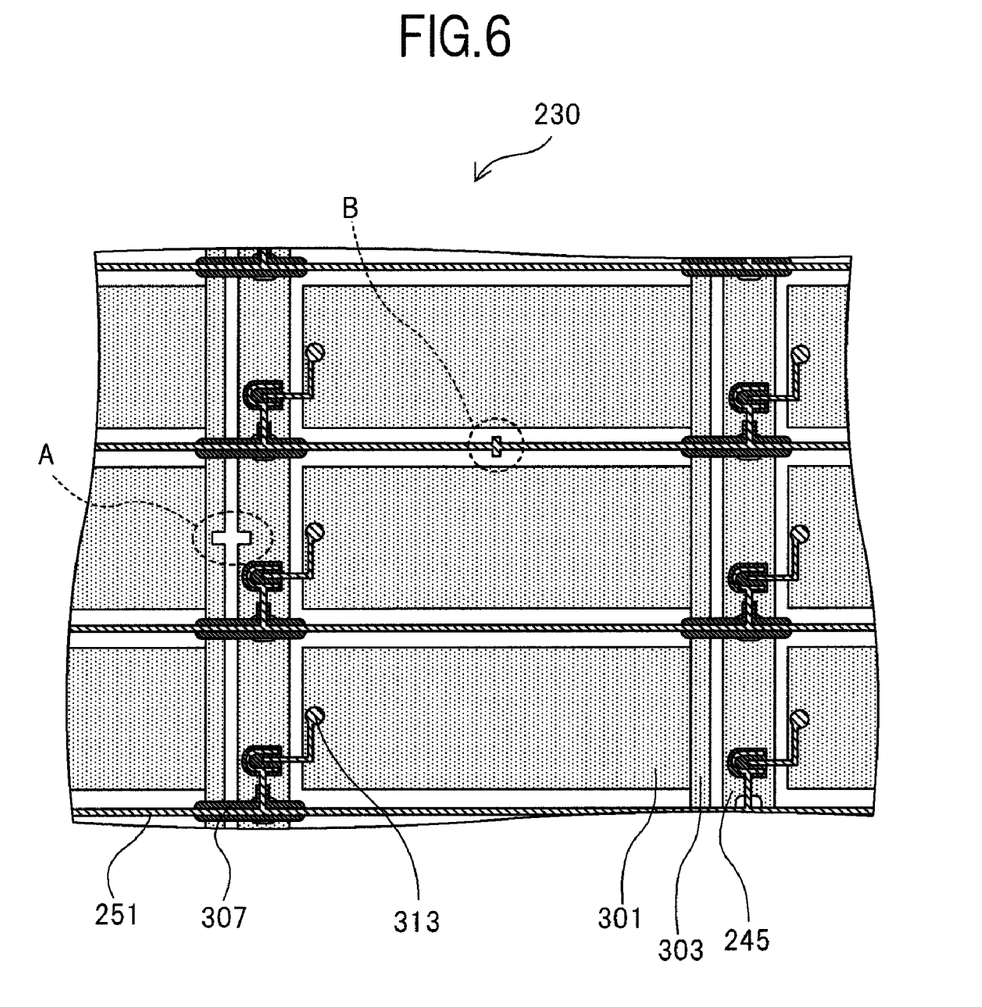
FIG. 6 is a view showing a state where drain signal lines and source electrodes of the TFT substrate are formed.

Subsequently, in step S14, the drain signal lines 251 and source electrodes 313 are formed by a film forming step, a photolithography step and an etching step. Also at the time of performing the exposure in this photolithography step, the alignment is performed using the portion "A" as an alignment mark. FIG. 6 shows a state where the drain signal lines 251 and the source electrodes 313 are formed. As shown in a portion "B" in FIG. 6, two projecting portions extending in the direction perpendicular to the extending direction of the drain signal line 251 are formed on a portion of the drain signal line 251. By combining the drain signal line 251 and these projecting portions with each other, a portion having a cruciform shape in appearance is formed.

Figure 7:
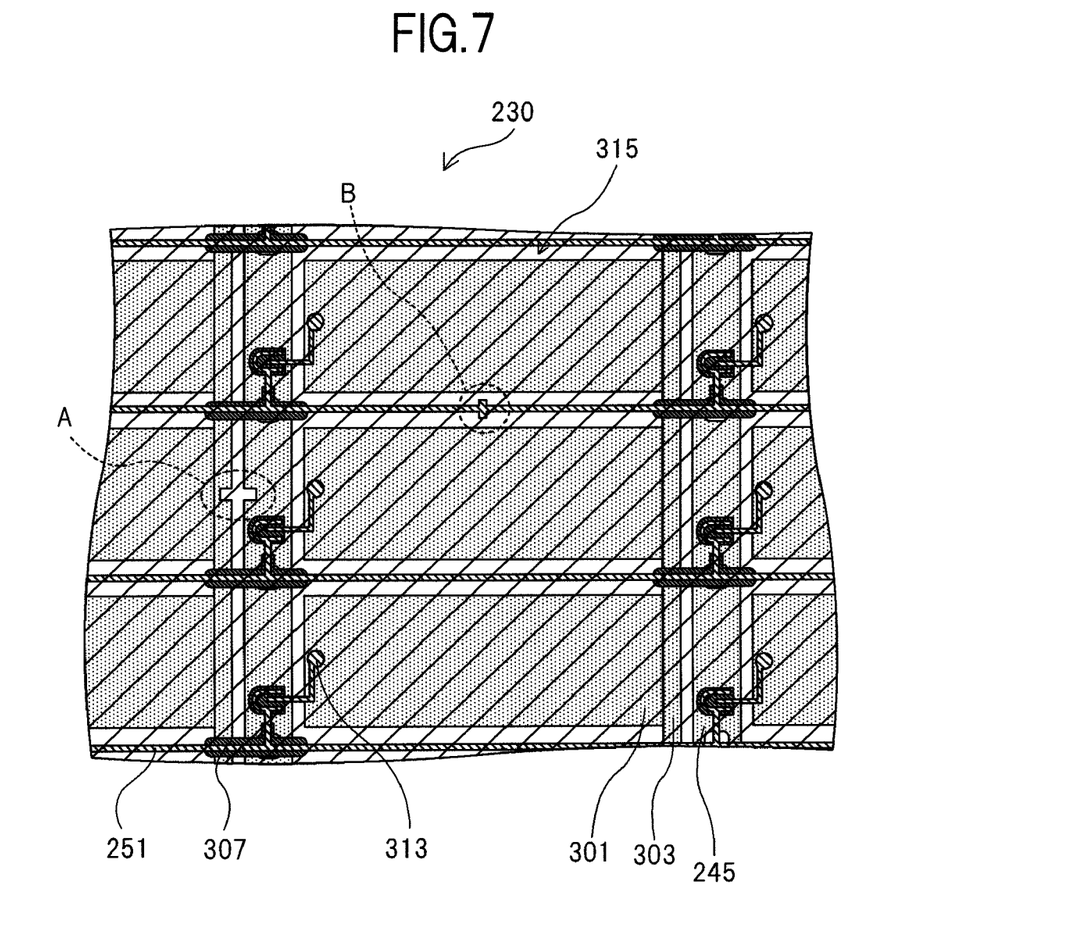
FIG. 7 is a view showing a state where a source/drain insulation film of the TFT substrate is formed.
Figure 8:
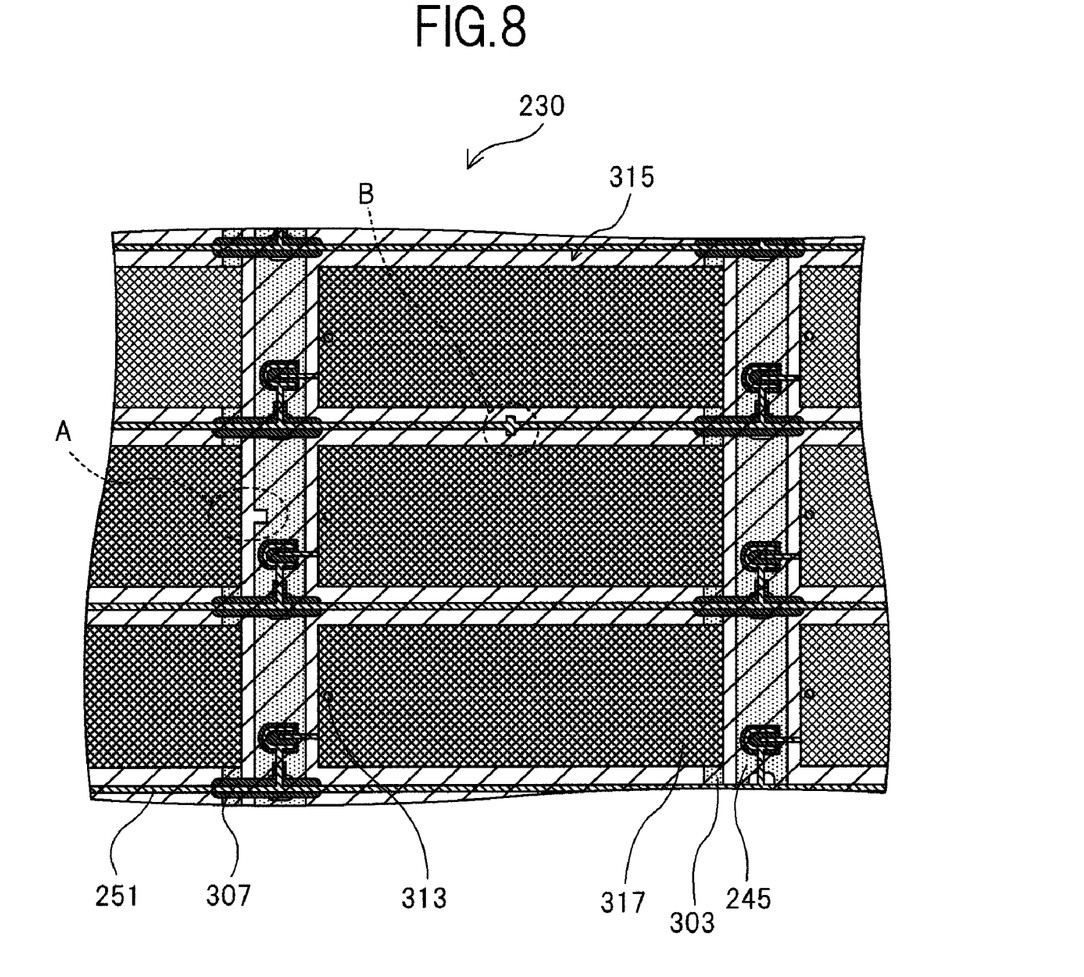
FIG. 8 is a view showing a state where pixel electrode films of the TFT substrate are formed.

Next, a source/drain insulation film 315 is formed (see FIG. 7) in step S15 and, subsequently, pixel electrode films 317 are formed by a film forming step, a photolithography step and an etching step in step S16. Here, at the time of performing the exposure in the photolithography step, the alignment is performed using the portion "A" and the portion "B" as alignment marks. FIG. 8 shows a state of the pixel electrode films 317 formed in this manner. In the liquid crystal display device 100 shown in FIG. 1 and the liquid crystal panel 200 shown in FIG. 2, the TFT substrate 230 which is manufactured by the above-mentioned manufacturing method is used.

Accordingly, in the above-mentioned embodiment, the alignment mark is formed by using the line within the display region and hence, it is possible to effectively make use of the area of the glass substrate without providing a special pattern for alignment use and, at the same time, it is possible to enhance a yield rate. Further, the alignment mark is formed as a portion of a wiring pattern which is arranged near a pixel and hence, it is possible to use the alignment mark as a small and accurate alignment mark. Further, the alignment mark is constituted of only one layer and hence, differently from alignment marks which are used in an overlapped manner in the multi-layered structure, it is possible to use the alignment mark without the erroneous detection.

FIG. 9 to FIG. 14 are views showing examples where the alignment mark of the invention is formed in a line constituted of a single layer.

Figure 9:
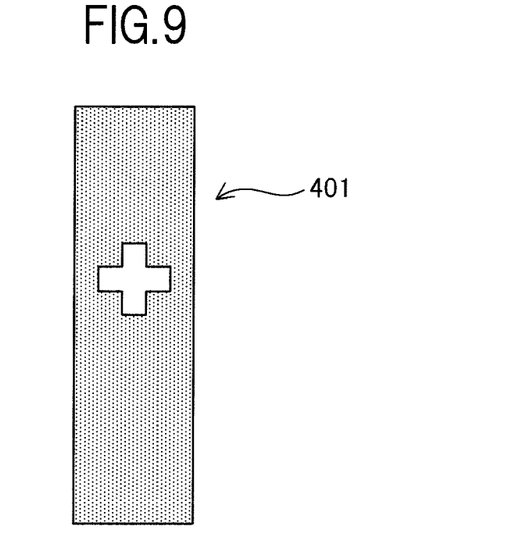
FIG. 9 is a view showing an example in which an alignment mark of the invention is formed on a line in a single layer.
Figure 10:
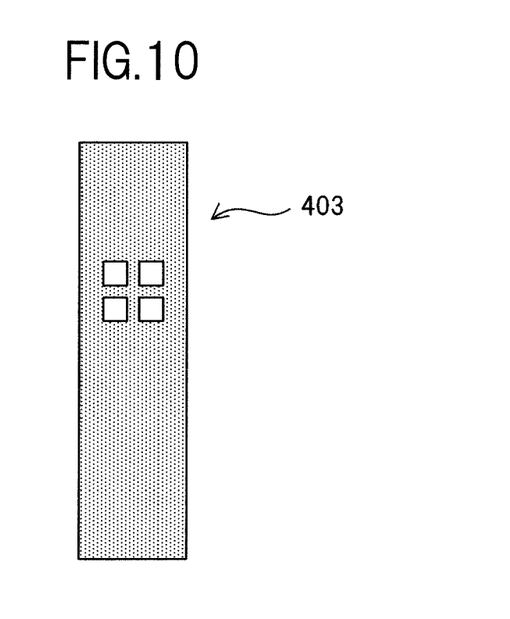
FIG. 10 is a view showing an example in which an alignment mark of the invention is formed on a line in a single layer.
Figure 11:
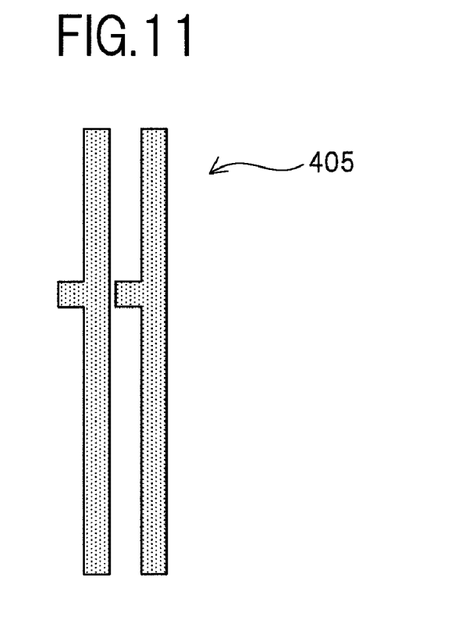
FIG. 11 is a view showing an example in which an alignment mark of the invention is formed on a line in a single layer.
Figure 12:
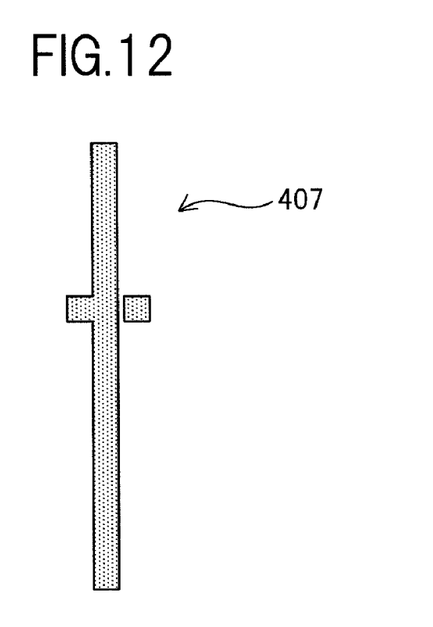
FIG. 12 is a view showing an example in which an alignment mark of the invention is formed on a line in a single layer.
Figure 13:
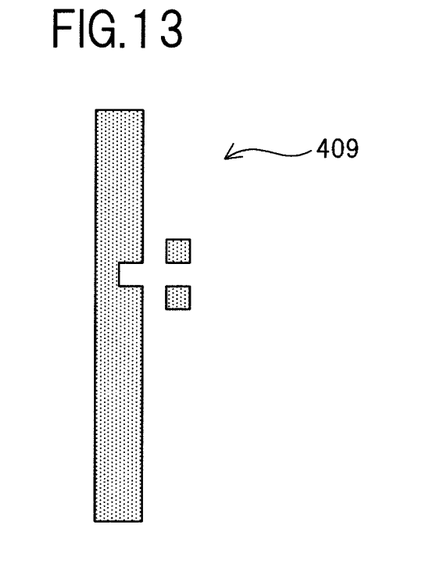
FIG. 13 is a view showing an example in which an alignment mark of the invention is formed on a line in a single layer.
Figure 14:
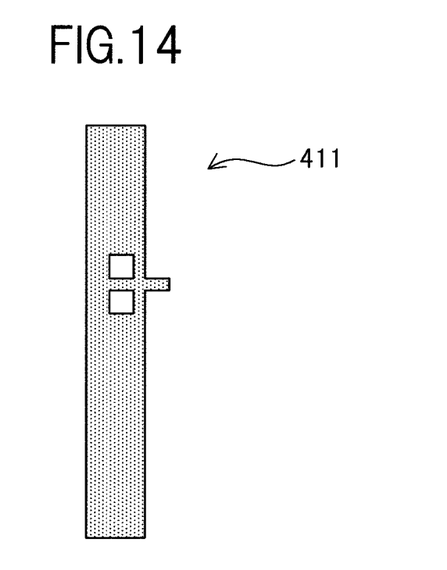
FIG. 14 is a view showing an example in which an alignment mark of the invention is formed on a line in a single layer.

FIG. 9 shows a case where an alignment mark is formed by forming a cruciform cutout in one line. FIG. 10 shows a case where an alignment mark having a cruciform shape in appearance is formed by forming four rectangular cutouts in one line. FIG. 11 shows a case where an alignment mark having a cruciform shape in appearance is formed by forming a projecting portion on each of two lines extending in the same direction, wherein the projecting portions extend in the direction perpendicular to the extending direction of the lines, and the projecting portions also extend in the same direction. FIG. 12 shows a case where an alignment mark having a cruciform shape in appearance is formed by combining a projecting portion extending in the direction perpendicular to the extending direction of one line, and one independent rectangular pattern arranged on a side opposite to the projecting portion. FIG. 13 shows a case where an alignment mark having a cruciform shape in appearance is formed by combining a cutout which is formed in one line in the direction perpendicular to the extending direction of the line and two independent rectangular patterns which are arranged on a side where the cutout is formed. FIG. 14 shows a case where an alignment mark having a cruciform shape in appearance is formed by combining a projecting portion which is formed on one line in the direction perpendicular to the extending direction of the line and two rectangular cutouts which are formed in the inside of the line.

FIG. 15 to FIG. 18 are views showing examples in which a portion of an alignment mark is formed on each of two layers, and the alignment mark is formed by combining the portions formed on the respective layers with each other. In the drawings, different hatchings are used for indicating that the layers are different from each other. Here, in the explanation made hereinafter, either one of the different layers constitutes an upper layer or a lower layer. However, the arrangement of the upper layer and the lower layer may be exchanged.

Figure 15:
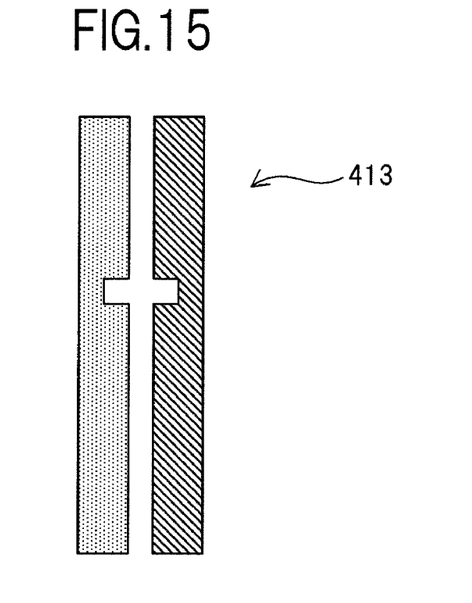
FIG. 15 is a view showing an example in which a portion of an alignment mark is formed on each of two layers, and the alignment mark is formed by combining the portions formed on the respective layers with each other.
Figure 16:
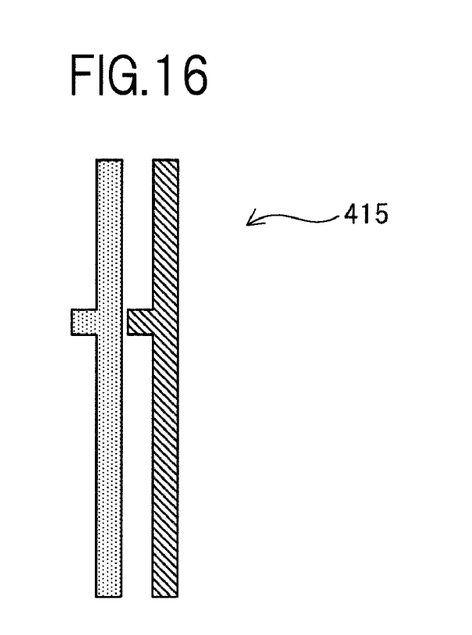
FIG. 16 is a view showing an example in which a portion of an alignment mark is formed on each of two layers, and the alignment mark is formed by combining the portions formed on the respective layers with each other.
Figure 17:
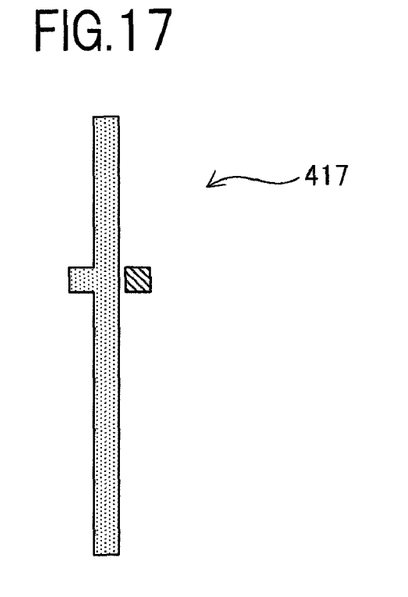
FIG. 17 is a view showing an example in which a portion of an alignment mark is formed on each of two layers, and the alignment mark is formed by combining the portions formed on the respective layers with each other.
Figure 18:
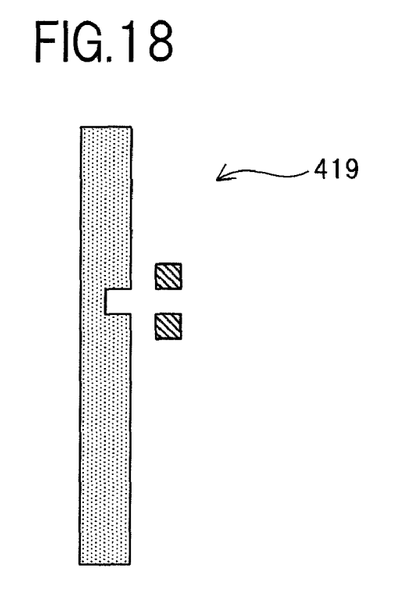
FIG. 18 is a view showing an example in which a portion of an alignment mark is formed on each of two layers, and the alignment mark is formed by combining the portions formed on the respective layers with each other.

FIG. 15 shows a case where an alignment mark having a cruciform shape in appearance is formed by combining one cutout which is formed in one line in the direction perpendicular to the extending direction of the line, and another cutout which is formed in another line formed above and parallel to the one line and faces the one cutout of the one line in an opposed manner. FIG. 16 shows a case where an alignment mark having a cruciform shape in appearance is formed by forming a one projecting portion which is formed on one line in the direction perpendicular to the extending direction of the one line, and another projecting portion which is formed on another line above and parallel to the one line, wherein the another projecting portion is in the same direction as the one projecting portion formed on the one line. FIG. 17 shows a case where an alignment mark having a cruciform shape in appearance is formed by combining a projecting portion which is formed on one line in the direction perpendicular to the extending direction of the one line and one independent rectangular pattern which is formed above the one line with each other. FIG. 18 shows a case where an alignment mark having a cruciform shape in appearance is formed by combining a cutout which is formed on one line in the direction perpendicular to the extending direction of the one line and two independent rectangular patterns which are formed above the one line.

Figure 19:
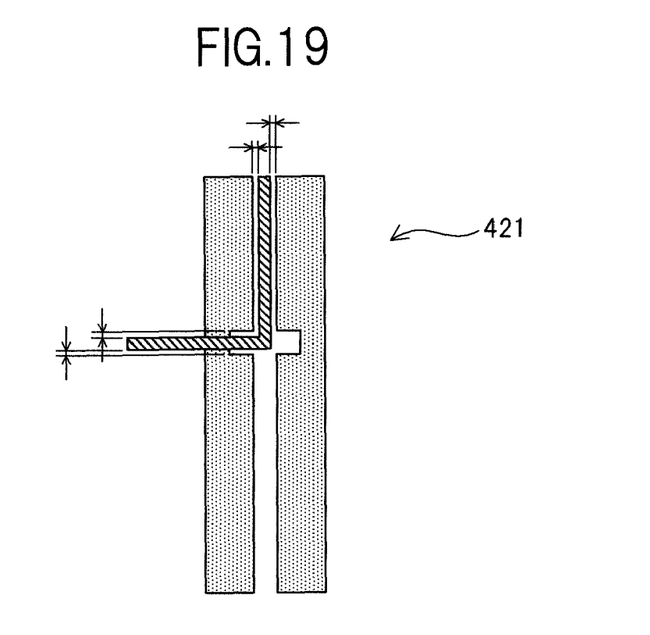
FIG. 19 is a view showing a case where a line is superposed on an alignment mark.

FIG. 19 is a view showing a case where a line is superposed on an alignment mark. As shown in FIG. 19, when the superposed line is arranged on the alignment mark, it is possible to detect the displacement between two layers by measuring a distance between the line and one side of an alignment shape. Although the alignment mark in FIG. 19 is formed by forming a cutout having a cruciform shape in one line, the alignment mark having other shape may be used.

Figure 20:
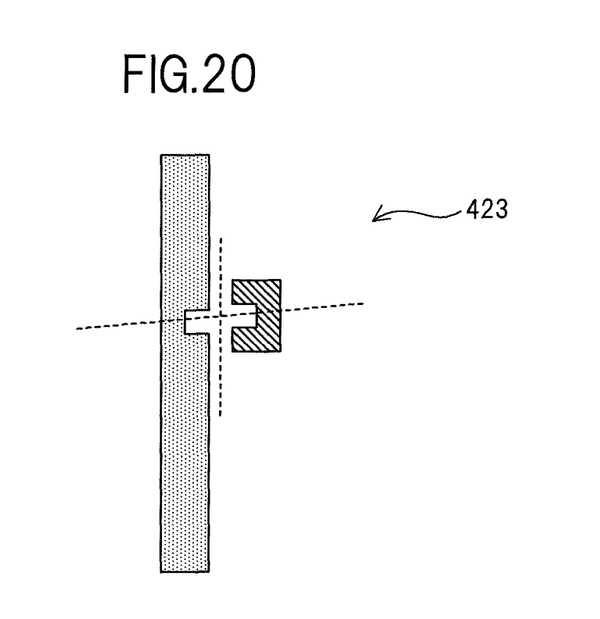
FIG. 20 is a view showing a case where portions of an alignment mark are shifted from each other when the portions are formed in two layers.

FIG. 20 shows a case where the alignment mark is formed by combining two portions which are formed in each of two layers, and two layers are shifted from each other. In such a case, by using the center of the displacement as the center of alignment, it is possible to assume the alignment mark as a reference indicating a proper exposure position.

Although the embodiments according to the invention and the modification thereof have been explained heretofore, the alignment mark is formed using the line in any modification. Accordingly, it is possible to effectively make use of the glass substrate without providing a special pattern for alignment use and, at the same time, it is possible to enhance a yield rate. Further, the alignment mark is formed as a portion of the wiring pattern which is arranged near the pixel and hence, the alignment mark can be used as a small and highly accurate alignment mark. Further, in the case where the alignment mark is formed only on one layer, differently from alignment marks which are superposed in multiple layers, it is possible to use the alignment mark without an erroneous detection.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A thin film transistor substrate which controls a display of a display device, comprising,
    a gate line of a transistor configured to be electrically connected to a drive circuit,
    wherein the gate line includes a portion having a first shape configured to serve as an alignment mark, and
    the alignment mark is configured to be within a display region of the display device.

2. The thin film transistor substrate according to claim 1, wherein the portion having the first shape is formed by a cutout in the gate line.

3. The thin film transistor substrate according to claim 2, wherein the cutout has a cruciform shape.

4. The thin film transistor substrate according to claim 1, wherein the portion having the first shape is formed by a projecting portion of the gate line projecting in the direction perpendicular to an extending direction of the gate line.

5. The thin film transistor substrate according to claim 1, further comprising:

a first metal line which is parallel to an extending direction of the gate line,
wherein the alignment mark includes a portion having a second shape formed as a part of the first metal line.

6. The thin film transistor substrate according to claim 5, wherein, in both of the gate line and the first metal line which extend parallel to each other, the portions having the first and second shapes are formed by cutouts which are arranged perpendicular to the extending direction and are opened in an opposed manner in the gate line and the first metal line.

7. The thin film transistor substrate according to claim 5, wherein, in both of the gate line and the first metal line which extend parallel to each other, the portions having the first and second shapes are formed by projecting portions projecting in the direction perpendicular to the extending direction of the gate line and the first metal line.

8. The thin film transistor substrate according to claim 1, further comprising,
a pattern which is electrically independent from the gate line and to which a voltage is not applied, and the pattern forms the alignment mark together with the portion having the first shape.

9. The thin film transistor substrate according to claim 1, further comprising:
a first metal line which has a portion having a second shape, and the portion having the second shape forms the alignment mark together with the portion having the first shape in the gate line.

10. The thin film transistor substrate according to claim 9, wherein the first metal line is formed of a source/drain line.

11. The thin-film transistor substrate according to claim 1, wherein the alignment mark is located adjacent to a pixel of the display device.

12. The thin-film transistor substrate according to claim 1, wherein the alignment mark is comprised of only one layer.

13. The thin-film transistor substrate according to claim 11, wherein the alignment mark is comprised of only one layer.

14. The thin film transistor substrate according to claim 5, wherein, the first metal line is a common signal line connected to a counter electrode.

* * * * *